United States Patent [19]
Johnson

[11] Patent Number: 5,646,903
[45] Date of Patent: Jul. 8, 1997

[54] MEMORY CELL HAVING A SHARED READ/WRITE LINE

[75] Inventor: R. Anders Johnson, San Jose, Calif.

[73] Assignee: Xilinx, Inc., San Jose, Calif.

[21] Appl. No.: 611,895

[22] Filed: Mar. 6, 1996

[51] Int. Cl.[6] .................................................. G11C 11/40
[52] U.S. Cl. ............... 365/230.05; 365/239; 365/189.04; 365/221; 365/187
[58] Field of Search .............................. 365/230.05, 239, 365/189.04, 221, 187

[56] References Cited

U.S. PATENT DOCUMENTS

| 4,935,896 | 6/1990 | Matsumura et al. | 365/187 |
| 5,513,139 | 4/1996 | Butler | 365/189.04 |

OTHER PUBLICATIONS

"The New IEEE Standard Dictionary of Electrical and Electronics Terms", Fifth Edition, The Institute of Electrical and Electronic Engineers, Inc. 345 East 47th Street, New York, NY 10017–2394, Copyright 1993, p. 1064.

Neil H. E. Weste, Kamran Eshraghian, "Principles of CMOS VLSI Design", Copyright 1985, pp. 353–354.
Lance A. Glasser & Daniel W. Dobberpuhl, "The Design and Analysis of VLSI Circuits", Copyright 1985, pp. 393–395.
Edward J. McCluskey, "Logic Design Principles", Copyright 1986, pp. 526–527.

*Primary Examiner*—David C. Nelms
*Assistant Examiner*—Andrew Q. Tran
*Attorney, Agent, or Firm*—Wagner, Murabito & Hao; Jeanette S. Harms

[57] ABSTRACT

A DRAM memory having shared read/write lines. The DRAM memory is comprised of an array of 3T memory cells. Data is digitally stored in the form of capacitors that are either charged or discharged. Horizontal data lines are used to convey data bits to be stored in the array of memory cells. Vertical read/write lines are used to perform both read and write functions. Activating a single read/write line causes a bit of data from a memory cell to be placed onto a corresponding data line. Simultaneously, an inverted copy of that data bit is stored in an adjacent memory cell. Hence, instead of having a separate read line and a separate word line for each memory cell, the present invention has a dual function read/write word line.

17 Claims, 7 Drawing Sheets

MEMORY CELL HAVING A SHARED READ/WRITE LINE

FIELD OF THE INVENTION

The present invention pertains to the field of computer memories. More particularly, the present invention relates to read/write memory cells having shared read/write lines.

BACKGROUND OF THE INVENTION

Virtually every computer system requires some sort of memory. Data and computer programs for instructing the computer as to how the data is to be processed, are stored in a computer's memory. At a top level, magnetic and optical storage devices (e.g., hard disk drives, floppy disk drives, tape drives, optical disk drives, etc.), are often used to store data and computer programs. These devices have high capacities and offer a relatively inexpensive medium for storing vast amounts of data. The data is retained, even when the devices are powered down. However, a major disadvantage with using these storage devices is their slow access times. These devices are electro-mechanical in nature and involve physically moving a transducer to the appropriate locations before data can be written or retrieved.

In order to gain faster access to the data, computers typically also contain on-board memory chips. These memory chips allow data to be accessed electronically. There are basically two types of memory chips: Read-Only Memory (ROM) and Random-Access Memory (RAM). ROM chips are used to store data of a permanent nature. The data is typically loaded into the ROM by the manufacturer. Once written, the data is retained by the ROM indefinitely, even when power is turned off. A user may not subsequently change or alter the data. RAM chips, on the other hand, are more flexible and versatile. Although RAM loses its data whenever power is removed, data can be repeatedly written to and read from the RAM any number of times. Although the term "random access memory" implies that the memory locations may be accessed in any desired sequence, it is common usage to denote any read/write memory as RAM. ("New IEEE Standard Dictionary of Electrical and Electronic Terms", 1993, p. 1064). In the context of this disclosure, "RAM" does not necessarily denote randomly accessible.

RAM chips can be subdivided into two categories: Static and Dynamic RAMs (SRAMs and DRAMs). SRAMs are generally constructed from latches, which endow the SRAMs with superior speed. However, SRAMs are relatively expensive to fabricate. Although DRAMs are slower, they are less expensive. Hence, many computer systems contain a large "main" memory consisting of DRAMs for storing the bulk of the data and a small "cache" of SRAM memory for storing copies of the most recently accessed data.

DRAMs are constructed from an array of extremely tiny capacitors, each of which can be charged and discharged, thereby allowing bits of data (i.e., charged="1" and discharged="0") to be digitally stored. Associated transistors are used to control these capacitors so that data can be written to and read from certain, specified locations or "addresses." Various DRAM structures are described in Weste & Eshraghian "Principles of CMOS VLSI Design" 1985, pp. 353-354 and Glasser & Dobberpuhl, and "Design and Analysis of VLSI Circuits", 1985, pp. 393-395.

FIG. 1 shows a portion of a prior art DRAM circuit. A 2×4 block comprising eight memory cells 101-108 is shown, wherein each memory cell includes three transistors and a capacitor. An individual memory cell has the capability of storing one bit of data. The bit of data is stored on the capacitor 114 which is sized to ensure adequate data storage time. Capacitor 114 may consist solely of the parasitic gate capacitance of transistor 113 and/or the parasitic drain capacitance of transistor 111, or it may include additional capacitance. Horizontal data lines DATA0-DATA3 route data to/from the rows of memory cells. In addition, each column of memory cells has a READ line as well as a WRITE line. These READ and WRITE lines are used for determining whether data is to be written to or read from a particular memory cell.

For example, memory cell 101 is comprised of a write transistor 111, a read transistor 112, a storage transistor 113, and capacitor 114. A write operation to memory cell 101 proceeds by placing data (either +5 V="1" or 0 V="0") on the DATA0 line and asserting the WRITE line 109. A read operation proceeds by precharging the DATA0 line and asserting the READ line 110, thereby turning on the read transistor 112 and opening a current path to the storage transistor 113. If capacitor 114 is charged, the storage transistor 113 is turned on, thereby causing the precharged DATA0 line to be pulled down to ground (0 V). Conversely, if capacitor 114 is not charged, the storage transistor 113 is turned off and the DATA0 line remains charged (+5 V). Because the data retrieved is backwards, a data inversion is subsequently required to return the correct data. It should be noted that the data stored in adjacent cells remain unaffected due to the high impedance of their respective write transistors and read transistors.

This prior art DRAM memory cell design is replicated millions of times. Computer systems today often come with 8, 16, or even 32 megabytes of DRAM. Hence, any improvement to this standard DRAM design would be magnified a million fold. The present invention offers such an improvement. The DRAM design of the present invention significantly reduces fabrication costs while, at the same time, maximizes storage capacity.

SUMMARY OF THE INVENTION

The present invention pertains to a DRAM memory having shared read/write lines. The DRAM memory is comprised of an array of three transistor memory cells. Data is digitally stored in the form of capacitors that are either charged or discharged. Horizontal data lines are used to convey data bits to be stored in the array of memory cells. Vertical read/write lines are used to perform both read and write functions. A single read/write line is shared by two columns of memory cells on each side of that line. Activating a read/write line causes a bit of data from a memory cell to be placed onto a corresponding data line. Simultaneously, an inverted copy of that data bit is stored in an adjacent memory cell. Thus, instead of having a separate read line and a separate word line for each memory cell, the present invention utilizes a dual function read/write word line, thereby dramatically reducing the control lines associated with read and write functions. As a result, fabrication costs are reduced because the die size is minimized. In addition, greater capacities can be achieved by eliminating half of the read and write lines.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

Figure 1:
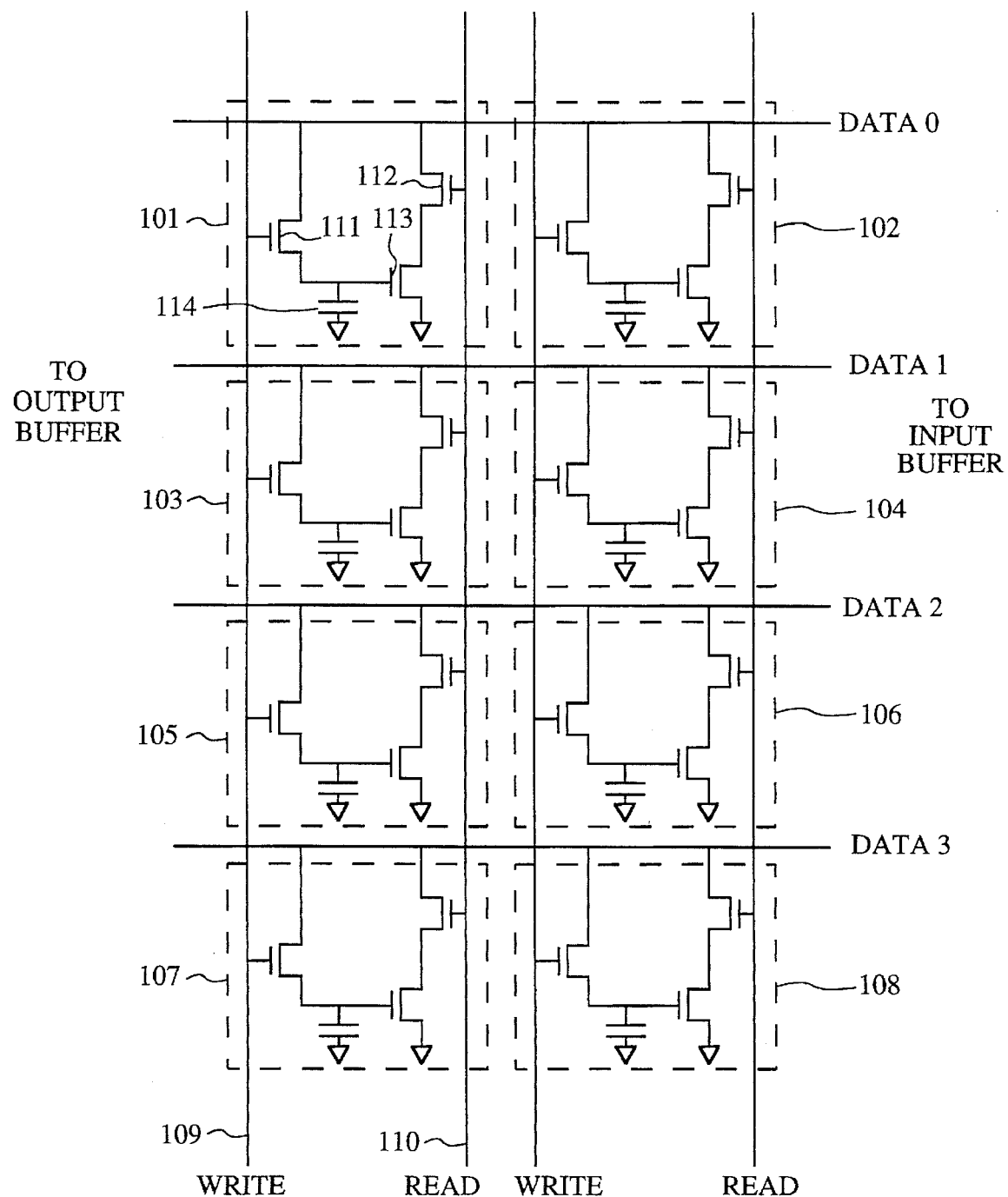
FIG. 1 shows a portion of a prior art DRAM circuit.
Figure 2:
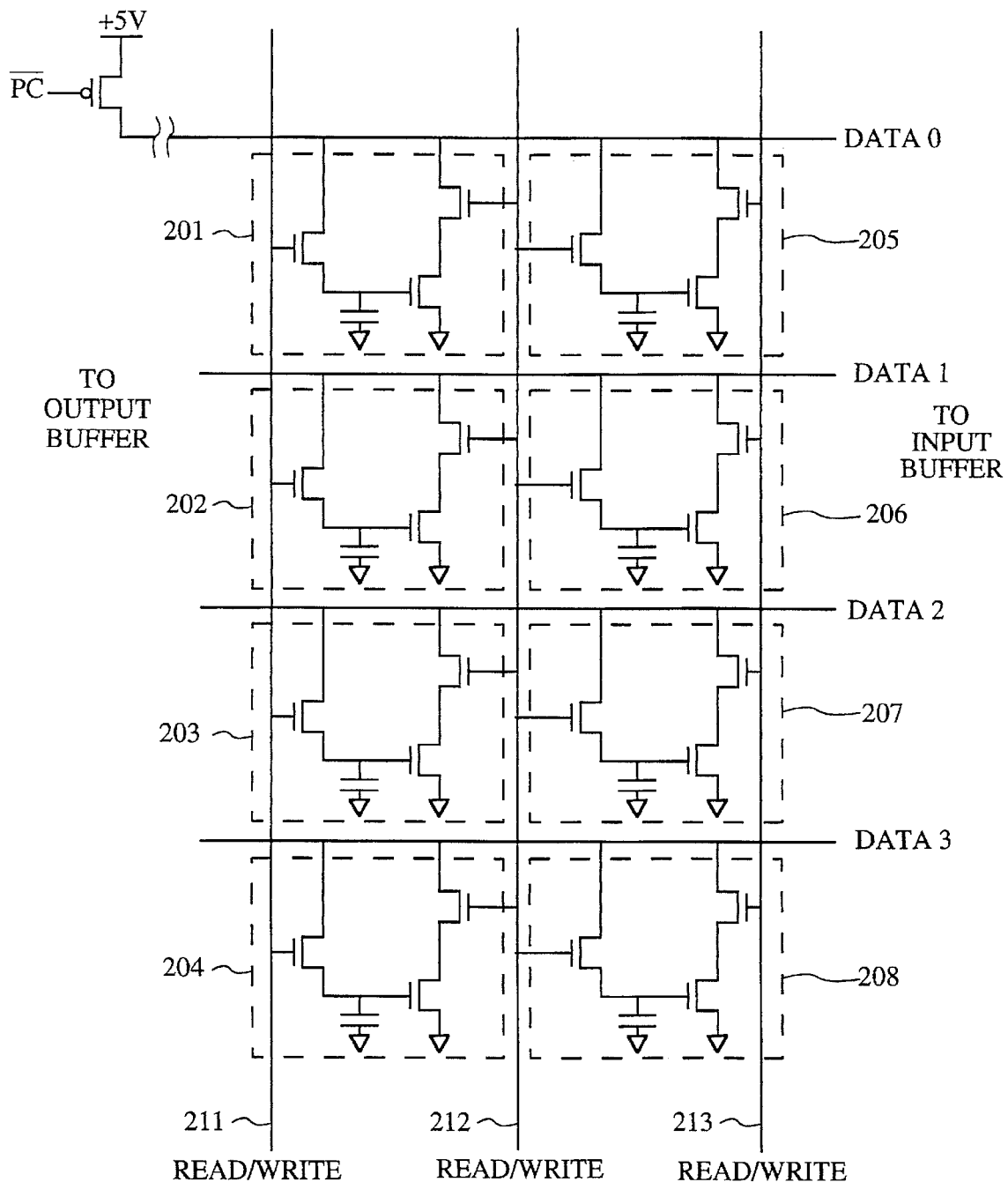
FIG. 2 shows a portion of a DRAM design with memory cells having shared READ/WRITE lines according to the present invention.

The present invention pertains to a DRAM memory that has shared READ/WRITE lines. Referring to FIG. 2, a portion of a DRAM design with memory cells having shared READ/WRITE lines according to the present invention is shown. More specifically, a 2×4 array of eight memory cells 201–208 is shown. It should be noted that this memory cell configuration can be replicated many times for achieving large scale memories. Only a small portion is shown here in order to more clearly demonstrate and explain the present invention. According to the present invention, the WRITE word line and the READ word lines are combined to form a single, common READ/WRITE line. By consolidating what had been two separate lines into a single line which performs dual functions, the number of metal traces required for fabrication of the device is reduced. Specifically, the number of READ and WRITE lines is reduced from X to ((X/2)+1). Minimizing the routing requirements is highly advantageous because the die size is proportionately reduced. In other words, a smaller die size means that more dies (i.e., chips) can be fabricated from a given semiconductor wafer, thereby lowering fabrication costs. Furthermore, eliminating approximately half of the READ and WRITE lines allows for greater density, and hence, provides a higher storage density for the device.

In accordance with the present invention, data is stored in the form of charged and discharged capacitors of each memory cell. The data is written to and read from the memory cells 201–208 via the DATA0–DATA3 lines. In turn, these data lines are routed to input and output buffers. The READ/WRITE lines 211–213 are used to perform simultaneous read and write functions. For example, activating READ/WRITE line 212 causes the bits stored in memory cells 201–204 to be read out on the DATA0–DATA3 lines. In addition, activating READ/WRITE line 212 also causes the bits in memory cells 201–204 to be written or copied inverted into memory cells 205–208. It should be noted that in the present invention, writing data to the cells and reading data from the cells affects the data in adjacent cells because the READ lines of the left column and the WRITE lines of the right column are combined and shared.

Figure 3:
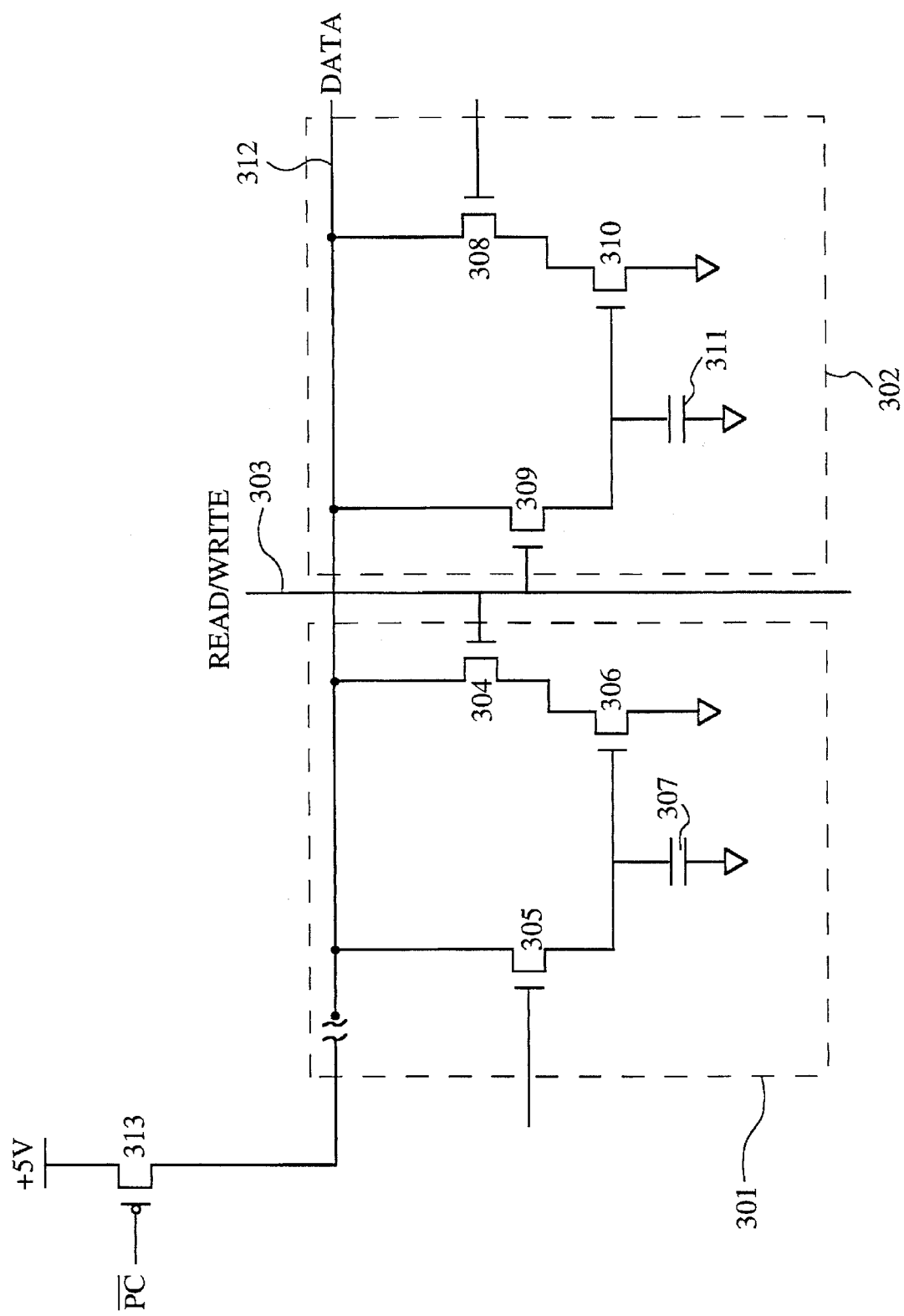
FIG. 3 is a schematic of two memory cells sharing a single, common READ/WRITE line.

FIG. 3 is a schematic of two memory cells 301–302 sharing a single, common READ/WRITE line 303, wherein each memory cell includes three transistors and a capacitor (i.e., a 3T DRAM cell). For example, memory cell 301 includes read transistor 304, write transistor 305, storage transistor 306, and capacitor 307. Similarly, memory cell 302 includes read transistor 308, write transistor 309, storage transistor 310, and capacitor 311. By reading from right to left, a fast sequential read is accomplished. A read operation proceeds by precharging the DATA line 312 via transistor 313 and asserting the READ/WRITE line 303 high. This process turns on the read transistor 304 of memory cell 301, thereby forming a current path to the storage transistor 306. If capacitor 307 happens to be charged with a high voltage (i.e., storing a "1"), storage transistor 306 is turned on, thereby pulling the voltage on pre-charged DATA line 312 to ground. In other words, DATA line 312 has 0 volts.

Conversely, if capacitor 307 is not currently storing a charge (i.e., storing a "0"), storage transistor 306 is turned off. Consequently, the DATA line 312 remains at its precharged high voltage level. Thus, the data bit from the memory cell 301 is placed on the DATA line 312 and is read by the output buffer (not shown). Asserting the READ/WRITE line 303 also simultaneously turns on the write transistor 309 of memory cell 302, thereby opening a current path to capacitor 311. Thus, the data bit being read out from memory cell 301 is copied inverted to memory cell 302. Hence, whenever a memory cell is read, its stored data bit is copied inverted to an adjacent memory cell.

Figure 4A:
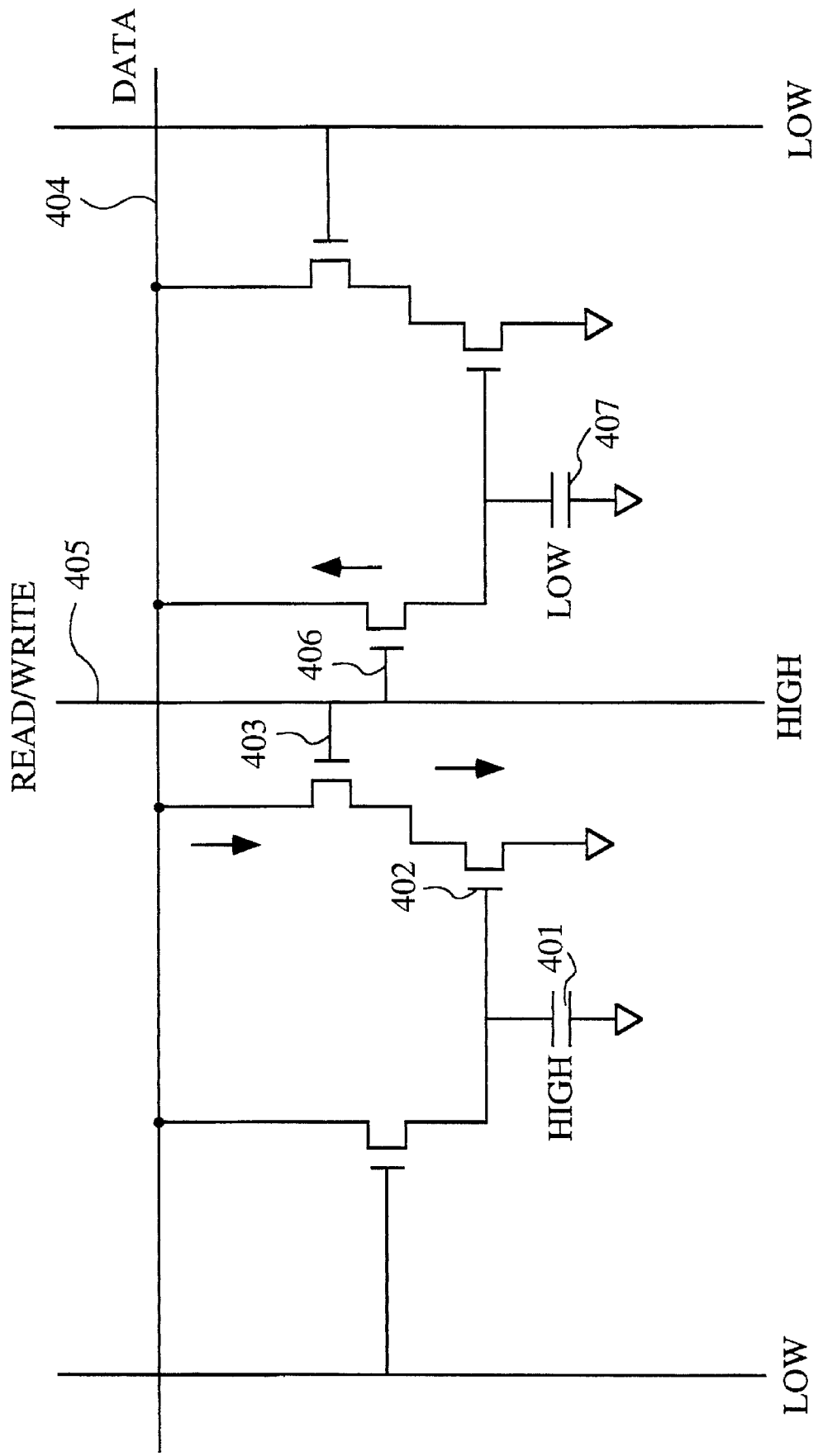
FIG. 4A shows the current flows associated with a READ/WRITE operation of a charged memory cell.

FIG. 4A shows the current flows associated with a READ/WRITE operation of a charged memory cell. It is assumed the capacitance of DATA line 404 is large compared to that of capacitors 401 and 407. Assuming a high voltage stored on capacitor 401 turns on transistor 402, and an active high on READ/WRITE line 405 turns on transistor 403, current flows from DATA line 404 to ground through transistors 403 and 402. The active high on READ/WRITE line 405 turns on transistor 406, thereby establishing a current path from capacitor 407 to DATA line 404 and discharging capacitor 407.

Figure 4B:
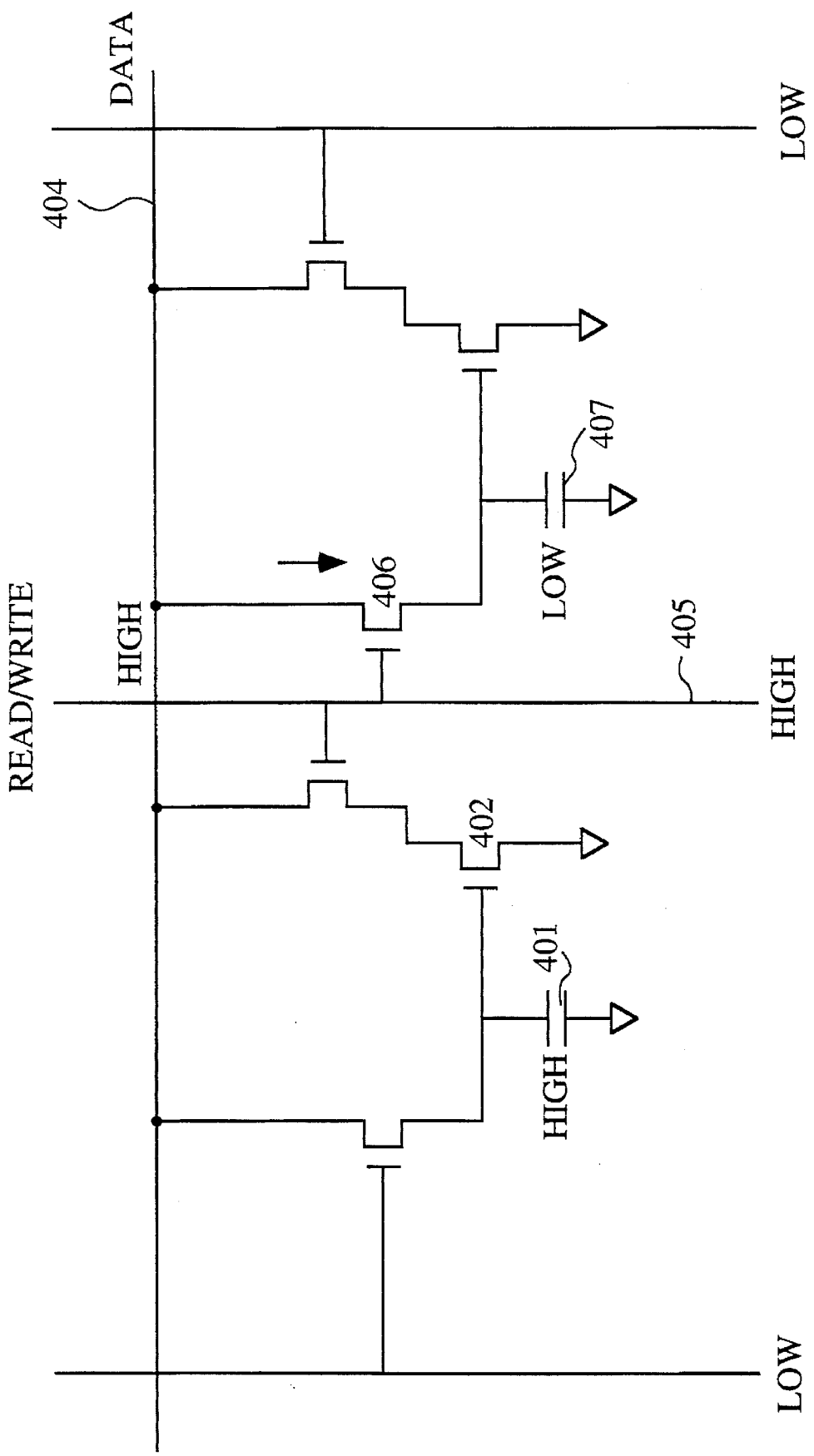
FIG. 4B shows the current flows associated with a READ/WRITE operation of a discharged memory cell.

FIG. 4B shows the current flows associated with a READ/WRITE operation of a discharged memory cell. A discharged capacitor 401 turns off transistor 402, thereby eliminating any current path between DATA line 404 and ground. Hence, the pre-charged DATA line 404 stays at its high pre-charged level. Furthermore, an active high on READ/WRITE line 405 turns on transistor 406, thereby establishing a current path from DATA line 404 to capacitor 407. Since DATA line 404 is at a high voltage, the current flow causes capacitor 407 to become charged.

Figure 5:
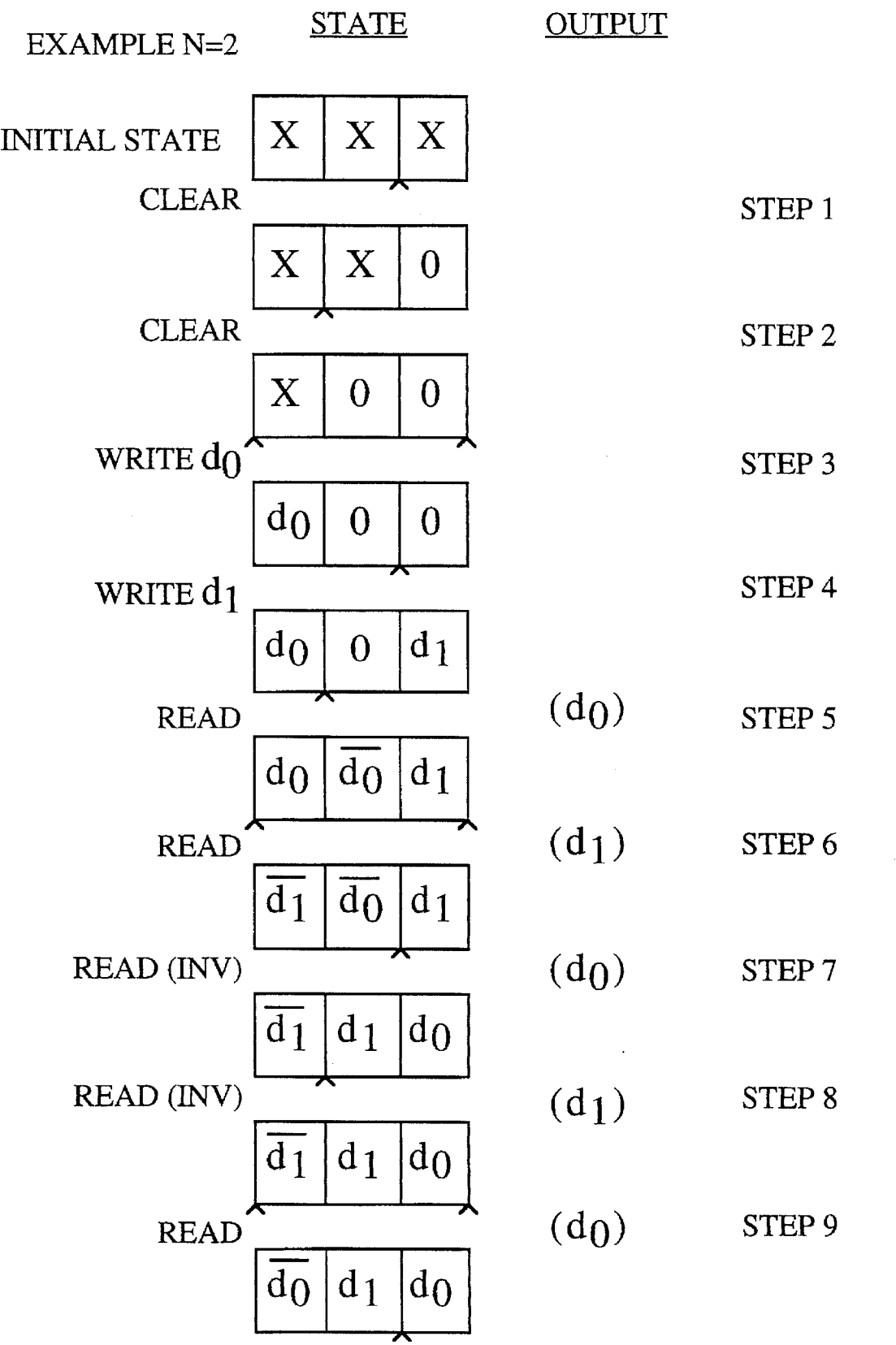
FIG. 5 illustrates a two-word storage and retrieval process utilizing the present invention.

In order to store a specified number of bits (N), a corresponding number of cells are required plus one additional cell (N+1). FIG. 5 illustrates a two-bit (N=2) storage and retrieval process utilizing the present invention. A short, two-bit sequence is shown for simplicity of explanation. In practice, much longer sequences are used to store the data. Initially, when power is first applied to the DRAM chip, it comes up in an arbitrary state, as indicated by the "Xs" of Step 1. The memory cells must be cleared to a known state (e.g., all "0's"). This clearing may be accomplished by holding the DATA line low and activating the READ/WRITE lines sequentially from right to left (see Steps 1 and 2). It is possible to write the "0" state without overpowering the column(s) being read because the DATA line is precharged. Therefore, a peripheral circuit can drive the DATA line low whether or not any of the cells in the corresponding row are also driving the DATA line low. Since the same data is being written, a bulk clear operation can be performed in one cycle by simultaneously pulling all DATA lines low while activating all READ/WRITE lines.

Once the memory cells have been cleared, two data bits (d0 and d1) are written in right-to-left order. It is possible to write an arbitrary data word into a column of cells without overpowering the column being read simultaneously (i.e. the column to the immediate left of the column being written) if the column being read contains an all "0" word. This process is possible because, as in FIG. 4B, transistor 402 is turned off and the DATA line is electronically isolated from the column being read. On the other hand, if the peripheral DATA line drivers are guaranteed to overpower the column being read, then data can be written into the array in any order without requiring an initial clear. However, this operation is likely to consume more power due to the possible contention between the column being read and the value being written. In FIG. 5, a caret underscores the READ/WRITE line that is activated high. In one embodiment, the appropriate READ/WRITE line is selected based on an address generated by one or more counters. This relieves the user from the burden of generating the addresses, which generally must be sequential in order to achieve a useful behavior. Note that using a ring counter, see for example McCluskey "LOGIC DESIGN PRINCIPLES", 1986, pp. 526-527, eliminates the need to decode the address. The caret traverses one memory cell per operation from right-to-left. When the left-most memory cell is reached, the caret wraps back to the right-most memory cell. The wrap-back functionality can be implemented by supplying the same signal to the left-most READ/WRITE line as the right-most READ/WRITE line. That is, the leftmost column is written when the rightmost column is read. In this example, the first data bit d0 is written into the left-most memory cell, Step 3, because the caret happened to land at that particular position after the last clear operation. Once the first data bit has been written, the caret wraps around to the right-most cell. Hence, the second data bit d1 is written to the right-most cell, Step 4. The caret then advances to the middle memory cell. Now, the two data bits have been properly loaded in the memory cells.

Figure 6:
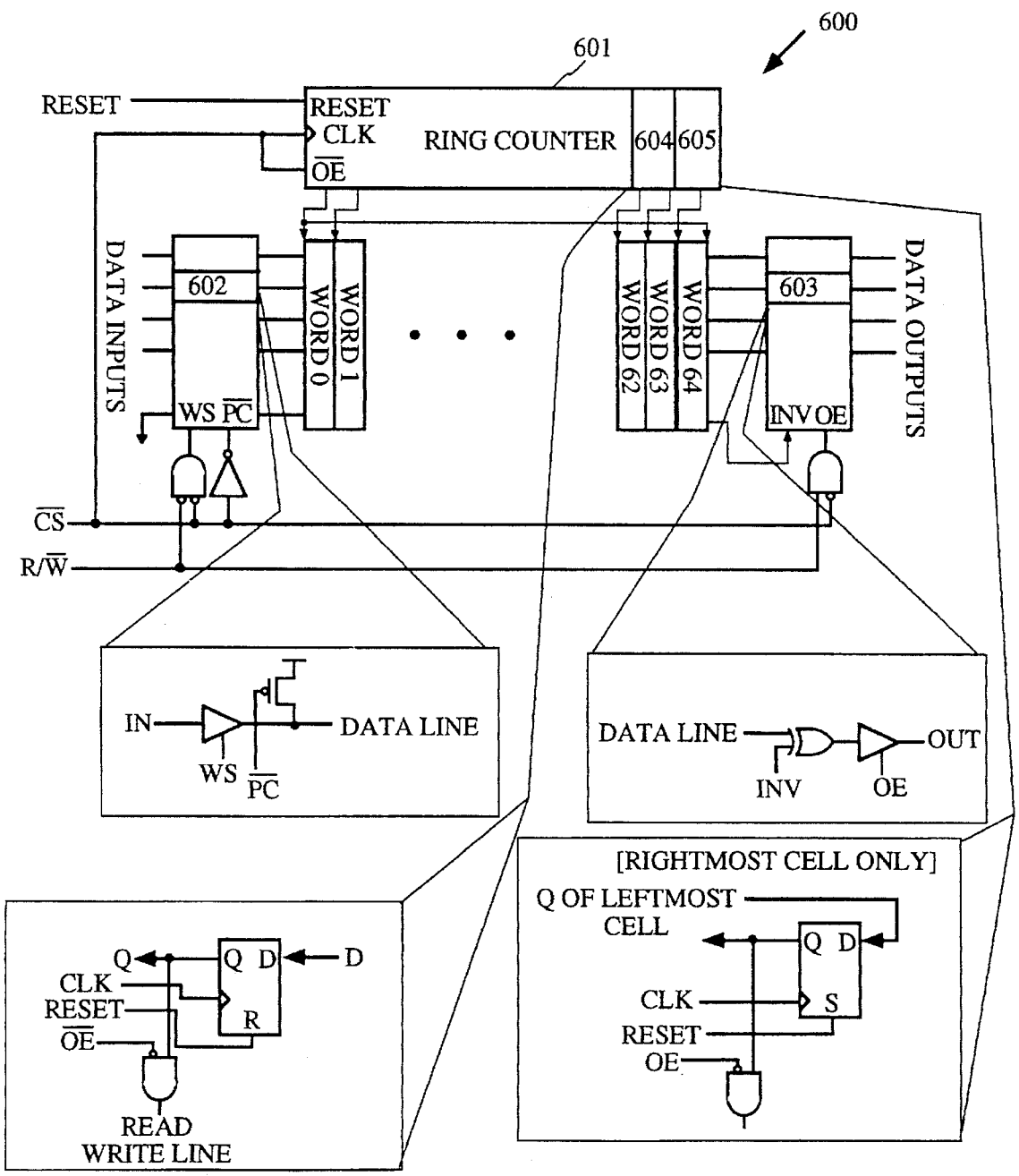
FIG. 6 shows one architecture of a RAM controller which stores 64 words of 4 bits each.

These data bits are later read back from the memory cells upon which they were stored. For read operations, the cells are read from right to left. When a data bit is read, a complement (i.e., inverted) copy is written to an adjacent memory cell to the immediate right of the memory cell containing the data bit being read. In other words, the nature of the read operation results in the stored data bits shifting one cell to the right, in an inverted form, for any N+1 row of cells. Thus, the output data bits must be reversed every N reads in order to maintain consistency of data integrity. In one embodiment, a mechanism (e.g., control circuitry) restores the data to its correct polarity. For example, an XOR gate could be used to perform this function. One way to keep track of which data words are inverted is to add an extra row to the array to indicate whether each column is inverted. When a data word is initially written, a "0" is written to this extra row. During a read, if the extra row reads "1", then the data word should be inverted to restore its original polarity. See for example, FIG. 6, which shows an illustrative RAM controller architecture 600 which includes a ring counter 601 having a plurality of flip-flops (for example, flip-flops 604 and 605). Architecture 600 further includes a plurality of data input circuits 602 (of which only one is shown) and data output circuits 603 (also only one being shown). Note that a first in first out (FIFO) implementation (not shown) requires two ring counters and handshaking (i.e. full/empty) logic. McCluskey, pp. 526-527, provides additional information regarding the operation and configuration of ring counter 601, and is incorporated herein by reference.

Referring back to FIG. 5, in Step 5, the d0 data bit is read from the left-most memory cell. Simultaneously, an inverted d0 bit is written to the middle memory cell. Likewise, when the d1 bit is read in Step 6, an inverted d1 bit is copied to the left-most cell (because of the wrap-back). Subsequent read operations will result in correct data retrieval, as demonstrated in Steps 7 and 8, notwithstanding the fact that an inverted copy is written with each associated bit being read. It can be seen that the process repeats, as evidenced by the fact that the state after Step 9 is the same as the state after Step 5 rotated two columns to the right. Because the array effectively wraps around from left to right (that is, it is rotationally symmetric), these two states are effectively identical.

The present invention is ideally applied to those applications which perform fast sequential reads and writes. For example, the present invention can be applied to frame grabbers for storing video data and first-in-first-out (FIFO) memories commonly used in printers and fax machines, etc. In conclusion, the present invention provides a fast sequential read from a three transistor memory cell, wherein the memory cell occupies less space, is less expensive to manufacture, and performs a faster sequential reads when compared to similar conventional three transistor (3T) DRAM cells.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention only be defined by the claims appended hereto and their equivalents.

I claim:

1. A memory for storing digital data comprising:

a first memory cell for storing a first bit of information;

a second memory cell for storing a second bit of information;

a data line coupled to the first memory cell and the second memory cell for conducting the first bit of information and the second bit of information, wherein said data line transfers said first bit of information into said second memory cell; and a control line coupled to the first memory cell and the second memory cell, wherein activating the control line causes a read operation to be performed on the first memory cell and a write operation to be performed on the second memory cell.

2. The memory of claim 1, wherein the first memory cell is comprised of:

a first transistor coupled to the data line for controlling when the first memory cell is to be written;

a second transistor coupled to the data line for controlling when the first memory cell is to be read;

a storage node coupled to the first transistor for storing the bit of information according to a high or low voltage of the storage node;

a third transistor coupled to the second transistor and the storage node for providing a signal path from the the storage node through the second transistor to the data line; and a capacitor coupled to said storage node, wherein said capacitor may consist of the parasitic capacitance of said third transistor or said first transistor.

3. The memory of claim 1, wherein activating the control line causes the first bit to be read from the first memory cell and an inverted copy of the first bit of information to be written to the second memory cell.

4. The memory of claim 2 further comprising a circuit for clearing the memory after power is applied to the memory by pulling all data lines low while activating all read/write lines.

5. The memory of claim 1, wherein data is read sequentially.

6. The memory of claim 1, wherein the first memory cell and the second memory cell are comprised of 3T DRAM cells.

7. The memory of claim 3 wherein a row of memory cells indicates whether or not the data in each column is inverted.

8. The memory of claim 1 wherein a counter is used for selecting said control line.

9. The memory of claim 8 wherein said counter is a ring counter.

10. The memory of claim 3 wherein an XOR gate is used to restore inverted data to its original polarity.

11. A DRAM memory comprising:

an array of 3T memory cells;

a plurality of data lines coupled to the memory cells, wherein the data is written to the memory cells and read from the memory cells through the data lines;

a plurality of read/write lines coupled to the memory cells, wherein activating one of the read/write lines causes a bit stored in a first memory cell coupled to the read/write line to be conducted to one of the data lines and an inverted copy of the bit to be stored in a second memory cell also coupled to the read/write line.

12. The DRAM memory of claim 11, wherein a signal is applied to both a left-most read/write line and a right-most read/write line.

13. The DRAM memory of claim 11, wherein one of the memory cells is comprised of:

a first transistor coupled to a particular data line for controlling when the memory cell is to be written;

a second transistor coupled to the particular data line for controlling when the memory cell is to be read;

a storage node coupled to the first transistor for storing a bit according to a high or low voltage of the storage node;

a third transistor coupled to the second transistor and the storage node for providing a signal path from the storage node through the second transistor to the particular data line; and a capacitor coupled to said storage node, wherein said capacitor may consist of the parasitic capacitance of said third transistor or said first transistor.

14. A method for accessing digital data stored in a memory, comprising the steps of:

clearing a first memory cell, a second memory cell, and a third memory cell;

placing a first bit of information on a data line;

activating a first control line to write the first bit of information to the first memory cell;

placing a second bit of information on the data line;

activating a second control line to write the second bit of information to the second memory cell;

activating a third control line to read the first memory cell, wherein activating the third control line also simultaneously writes an inverted copy of the first bit of information to the third memory cell.

15. The method of claim 14 further comprising the step of changing the output polarity for every N read operations, wherein N is a number of columns of bits of information in the memory.

16. The method of claim 14 further comprising the step of sequentially reading data from the memory cells.

17. The method of claim 14 further comprising the step of transmitting a same signal to a left-most control line and to a right-most control line.

* * * * *